United States Patent
Kang

(10) Patent No.: US 8,187,479 B2
(45) Date of Patent: May 29, 2012

(54) MANUFACTURING METHOD OF PRINTED CIRCUIT BOARD

(75) Inventor: Myung-Sam Kang, Hwaseong-si (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 813 days.

(21) Appl. No.: 12/273,961

(22) Filed: Nov. 19, 2008

(65) Prior Publication Data
US 2009/0321387 A1 Dec. 31, 2009

(30) Foreign Application Priority Data

Jun. 30, 2008 (KR) .......................... 10-2008-0062649

(51) Int. Cl.
*B44C 1/22* (2006.01)

(52) U.S. Cl. ................. 216/13; 216/20; 216/40

(58) Field of Classification Search ............. 216/13, 216/20, 40
See application file for complete search history.

(56) References Cited

U.S. PATENT DOCUMENTS
2007/0261234 A1* 11/2007 Song et al. ............. 29/829

FOREIGN PATENT DOCUMENTS

| EP | 1830611 A1 * | 9/2007 |
|---|---|---|
| JP | 10-173337 | 6/1998 |
| JP | 2003-309356 | 10/2003 |
| JP | 2004-119770 | 4/2004 |
| JP | 2004-146742 | 5/2004 |

OTHER PUBLICATIONS

Korean Office Action, with English translation, issued in Korean Patent Application No. 10-2008-0062649, dated Apr. 29, 2010.
Japanese Office Action issued in Japanese Patent Application No. JP 2008-309000 dated Jan. 4, 2011.

* cited by examiner

*Primary Examiner* — Nadine G Norton
*Assistant Examiner* — Mahmoud Dahimene
(74) *Attorney, Agent, or Firm* — McDermott Will & Emery LLP

(57) ABSTRACT

Disclosed is a manufacturing method of a printed circuit board. The method in accordance with an embodiment of the present invention includes: providing a laminated substrate having an insulator as well as a first metal layer and a second metal layer, which are sequentially laminated on one side of the insulator; processing a via hole in the laminated substrate; forming a seed layer on an inner wall of the via hole and on a surface of the second metal layer; plating an inside of the via hole and the surface of the second metal layer with a conductive material that is different from a material of the second metal layer; etching the seed layer and the conductive material, formed on the second metal layer; etching the second metal layer; and forming a first circuit pattern by selectively etching the first metal layer.

5 Claims, 38 Drawing Sheets

MANUFACTURING METHOD OF PRINTED CIRCUIT BOARD

CROSS-REFERENCE TO RELATED APPLICATIONS

This application claims the benefit of Korean Patent Application No. 10-2008-0062649, filed with the Korean Intellectual Property Office on Jun. 30, 2008, the disclosure of which is incorporated herein by reference in its entirety.

BACKGROUND

1. Technical Field

The present invention relates to a manufacturing method of a printed circuit board.

2. Description of the Related Art

At present, in manufacturing a rigid substrate, a copper clad laminate (CCL) is commonly used as a core material. With a method of laminating layers on the copper clad laminate, a multi-layer substrate is manufactured. Here, the copper clad laminate signifies a material made of an insulator 1 added by a glass fiber, etc., having copper foils 2 formed on both sides thereof, as shown in FIG. 1.

Recently, with increasing demands for portable, light and thin electronic devices having many abilities, a thin printed circuit board having high density is also increasingly required.

For that reason, a plating method using a seed layer is widely used as a method of implementing a high density circuit.

FIGS. 1 to 7 show a manufacturing method of a printed circuit board according to a related art. Referring to FIGS. 1 to 7, illustrated are an insulator 1, a copper foil 2, a via hole 3, a seed layer 4, a plating resist 5, a via 6 and patterns 7 and 8. A manufacturing method of a printed circuit board according to the related art will be concisely described below First, as shown in FIG. 1, prepared is a copper clad laminate made of an insulator 1 having copper foils 2 formed on both sides thereof, and then a via hole 3 is processed as shown in FIG. 2. A mechanical drill or a laser drill is used as a method of processing the via hole 3.

As shown in FIG. 3, a seed layer 4 is formed on the inner wall of the via hole 3 and on the surface of the copper foil 2, and then a plating resist 5 is formed as shown in FIG. 4. Subsequently, electrolytic plating is performed as shown in FIG. 5.

A printed circuit board having a predetermined via 6 and patterns 7 and 8 formed therein can be manufactured by removing the plating resist 5 as shown in FIG. 6 and a part of the seed layer 4 through a flash etching as shown in FIG. 7.

However, according to the related art, when a plating is performed in order to form the via 6, and the patterns 7 and 8, the thickness of the plated material is not uniform. Such a thickness difference becomes larger when the lower copper foil 2 is damaged during the via hole 3 processing as shown in FIG. 2.

Besides, since there is a case where an excessive etching is processed lest the seed layer 4 should remain when removing the seed layer 4, the pattern may have a possibility of occurrence of more excessive thickness deviation. Due to the reason, it is difficult to form a pattern having a thickness desired by a user.

SUMMARY

The present invention provides a manufacturing method of a high density printed circuit board having reliability.

An aspect of the present invention features a manufacturing method of a printed circuit board. The method in accordance with an embodiment of the present invention can provide: providing a laminated substrate comprising an insulator, a first metal layer and a second metal layer, the first metal layer and the second metal layer configured to be sequentially laminated on one side of the insulator; processing a via hole in the laminated substrate; forming a seed layer on an inner wall of the via hole and on a surface of the second metal layer; plating an inside of the via hole and the surface of the second metal layer with a conductive material, the conductive material being different from a material of the second metal layer; etching the seed layer and the conductive material formed on the second metal layer; etching the second metal layer; and forming a first circuit pattern by selectively etching the first metal layer.

Another aspect of the present invention features a manufacturing method of a printed circuit board. The method in accordance with an embodiment of the present invention can provide: providing a laminated substrate comprising an insulator, a first metal layer and a second metal layer, the first metal layer and the second metal layer configured to be sequentially laminated on one side of the insulator; processing a via hole in the laminated substrate; etching the second metal layer; forming a seed layer on an inner wall of the via hole and on a surface of the first metal layer; forming a patterned plating resist on the first metal layer; plating the seed layer and an inside of the via hole with a conductive material; removing the plating resist; and etching a part of the seed layer and a part of the first metal layer.

Yet another aspect of the present invention features a manufacturing method of a printed circuit board. The method in accordance with an embodiment of the present invention can provide: providing a laminated substrate comprising an insulator, a first metal layer and a second metal layer, the first metal layer and the second metal layer configured to be sequentially laminated on one side of the insulator; processing a via hole in the laminated substrate; forming a seed layer on an inner wall of the via hole and on a surface of the second metal layer; forming a patterned plating resist on the second metal layer; plating the seed layer and an inside of the via hole with a conductive material; removing the plating resist; etching a part of the seed layer; etching a part of the second metal layer; and etching a part of the first metal layer.

The manufacturing methods of the printed circuit board in accordance with various aspects of the present invention can feature as follows:

For example, the first metal layer and the conductive material can be made of a material comprising copper (Cu), and the second metal layer is made of a material comprising at least one of nickel (Ni), aluminum (Al) and chrome (Cr).

Meanwhile, the laminated substrate can be manufactured by plating the first metal layer laminated on the insulator with a material corresponding to the second metal layer. A circuit substrate having a second circuit pattern formed on the surface thereof can be laminated on another side of the insulator.

Additionally, the plating can be performed to allow the conductive material to be filled inside the via hole.

DETAILED DESCRIPTION

Figure 1:
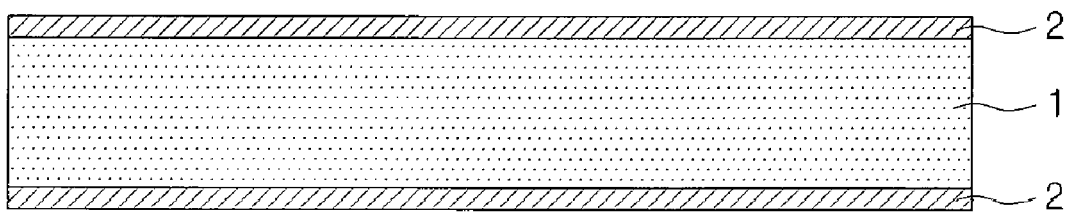
FIGS. 1 to 7 show a manufacturing method of a printed circuit board according to a related art.
Figure 2:
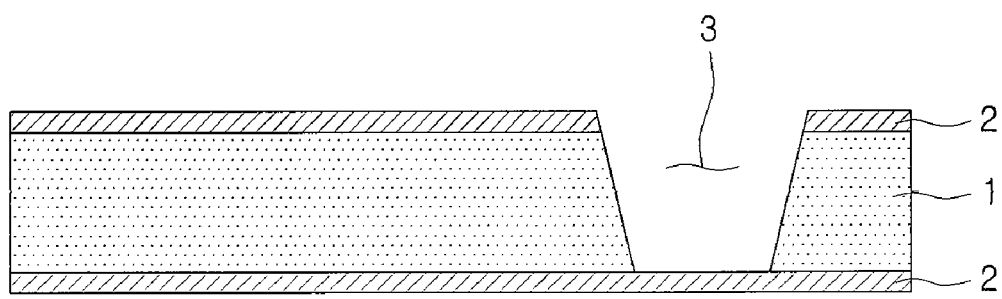
Figure 3:
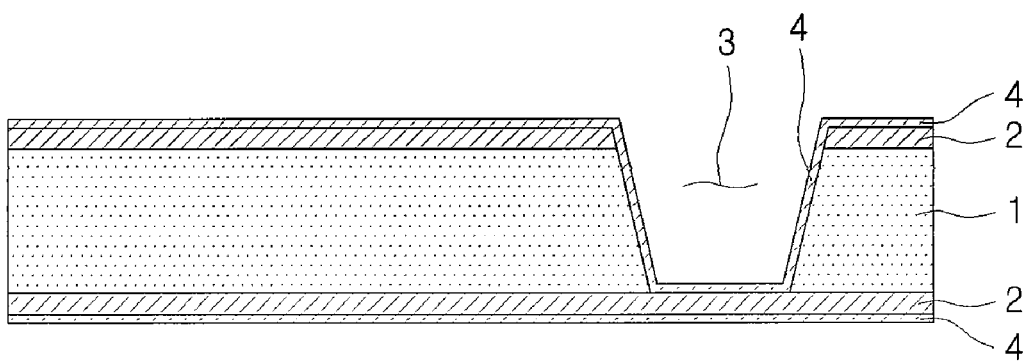
Figure 4:
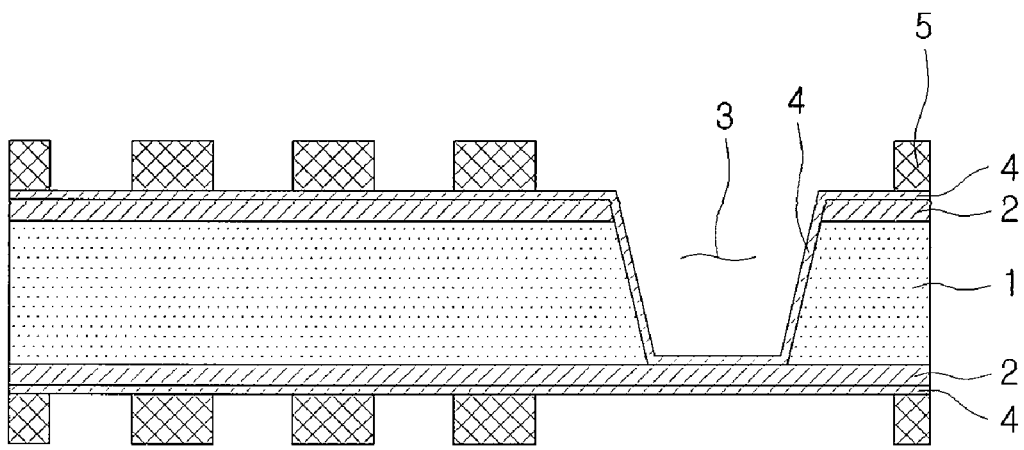
Figure 5:
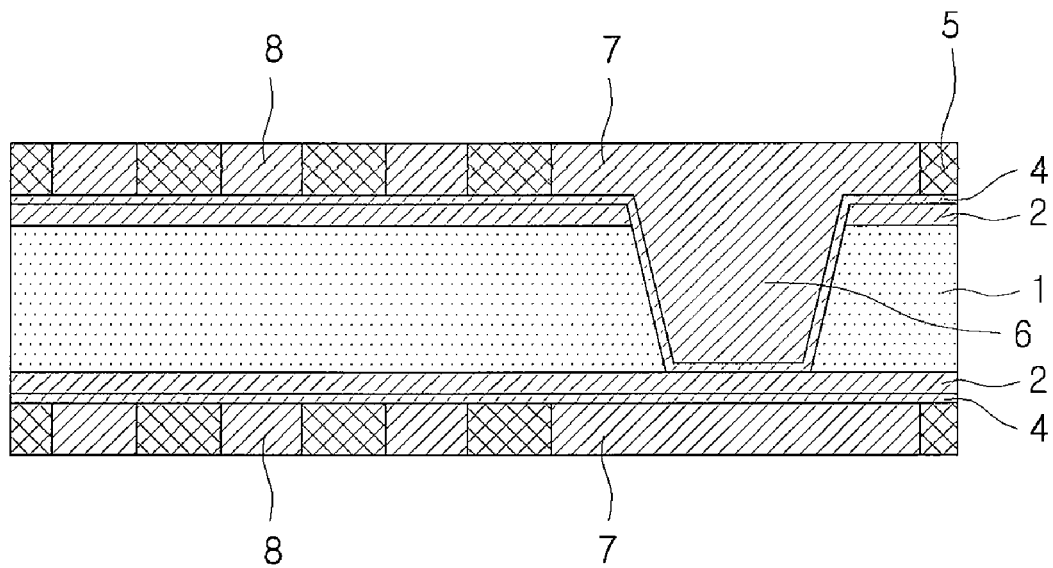
Figure 6:
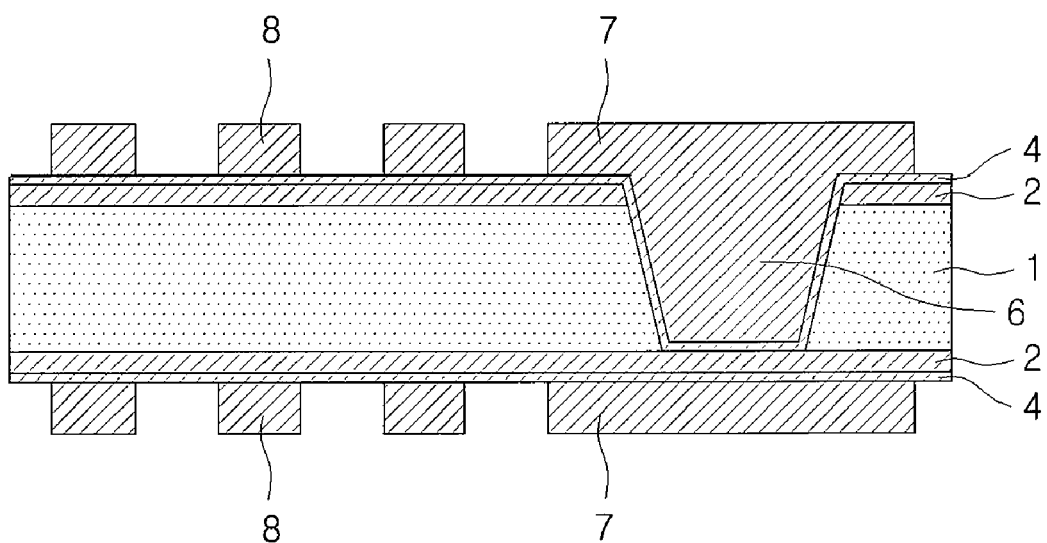
Figure 7:
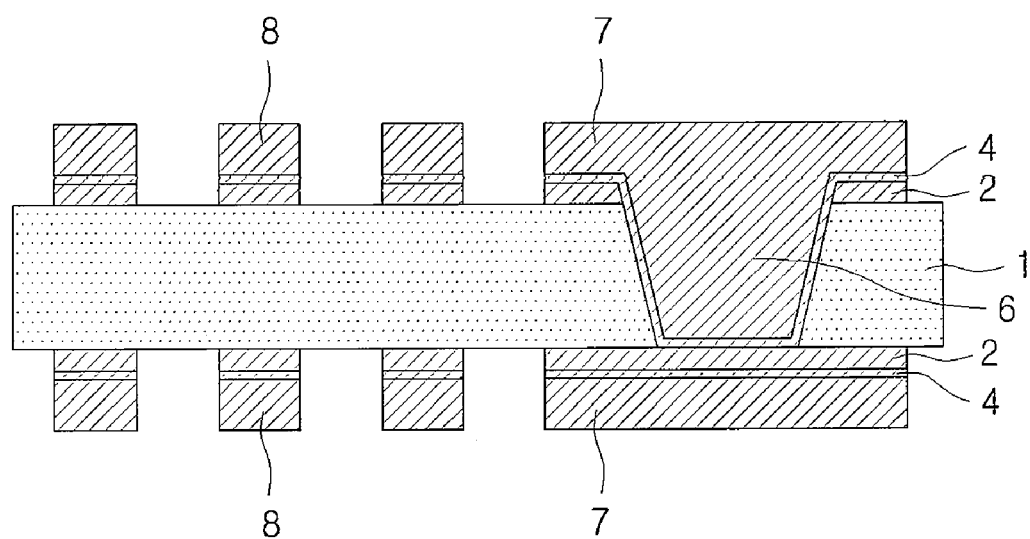

Since there can be a variety of permutations and embodiments of the present invention, certain embodiments will be illustrated and described with reference to the accompanying drawings.

Terms such as "first" and "second" can be used in describing various elements, but the above elements shall not be restricted to the above terms. The above terms are used only to distinguish one element from the other.

The terms used in the description are intended to describe certain embodiments only, and shall by no means restrict the present invention. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

Hereinafter, embodiments of a manufacturing method of a printed circuit board in accordance with the present invention will be described in detail with reference to the accompanying drawings. In description with reference to accompanying drawings, the same reference numerals will be assigned to the same or corresponding elements, and repetitive descriptions thereof will be omitted.

Figure 8:
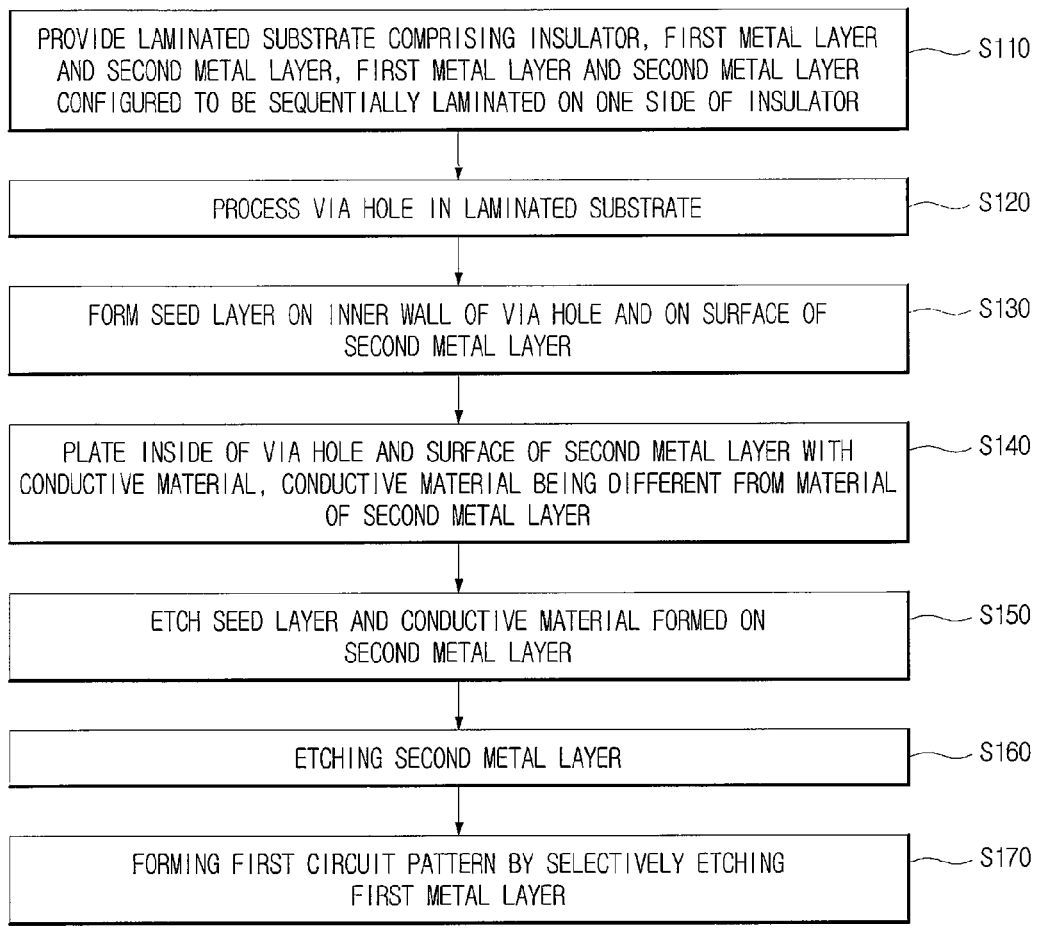
FIG. 8 shows a flowchart of a manufacturing method of a printed circuit board according to a first embodiment of the present invention.

FIG. 8 shows a flowchart of a manufacturing method of a printed circuit board according to a first embodiment of the present invention. FIGS. 9 to 21 show a manufacturing method of a printed circuit board according to a first embodiment of the present invention. Referring to FIGS. 9 to 21, illustrated are an insulator 11, a first metal layer 12, patterns 12a and 12b, a second metal layer 13, a via hole 15a, a via 15, a seed layer 16, a plating layer 17, an etching resist 18, a circuit substrate 20, patterns 21 and 23, and a via 22.

Figure 9:
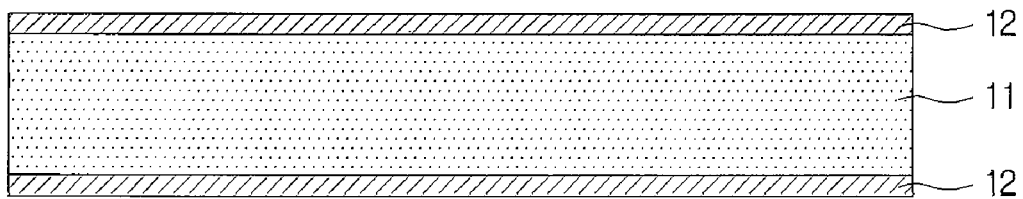
FIGS. 9 to 21 show a manufacturing method of a printed circuit board according to a first embodiment of the present invention.
Figure 10:
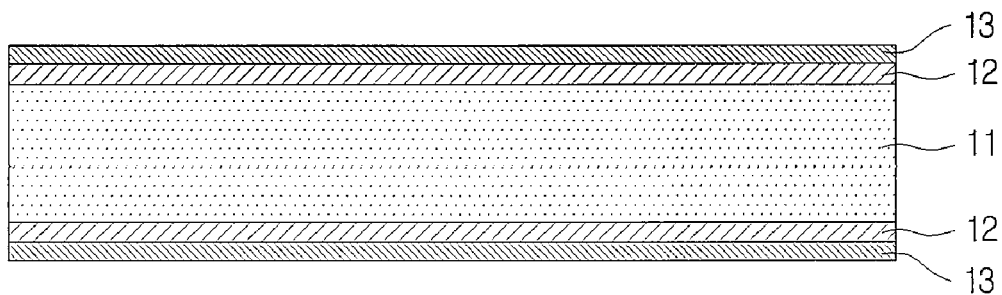

First, as shown in FIG. 10, provided is a laminated substrate including an insulator 11, and including a first metal layer 12 and a second metal layer 13 sequentially laminated on the insulator 11 (S110). That is, a laminated substrate having a dualized metal layer is prepared. For this, as shown in FIG. 9, it is possible to use a method of forming the second metal layer 13 by performing electrolytic plating onto a material having the insulator 11 that has the first metal layer 12 adhered thereto. In addition, it shall be evident that a method of adhering a film-type second metal layer to the first metal layer can be used.

Meanwhile, the material of the first metal layer 12 is different from that of the second metal layer 13. For example, the first metal layer 12 can be mainly made of copper. The second metal layer 13 can be mainly made of at least of nickel (Ni), aluminum (Al) and chrome (Cr) (e.g., sulfonic acid nickel).

Figure 11:
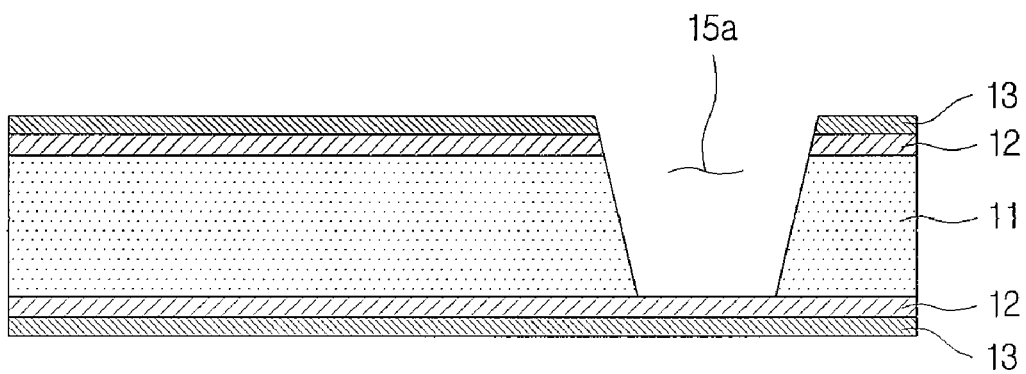

A via hole 15a is processed in the laminated substrate having such a dualized metal layer as shown in FIG. 11 (S120). In order to process the via hole 15a, a laser drill like a $CO_2$ laser can be used. In some cases, a mechanical drill can be also used.

Figure 12:
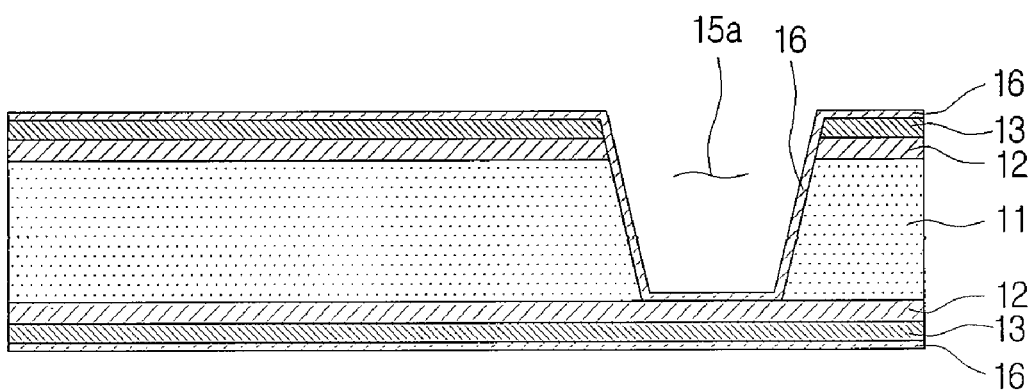
Figure 13:
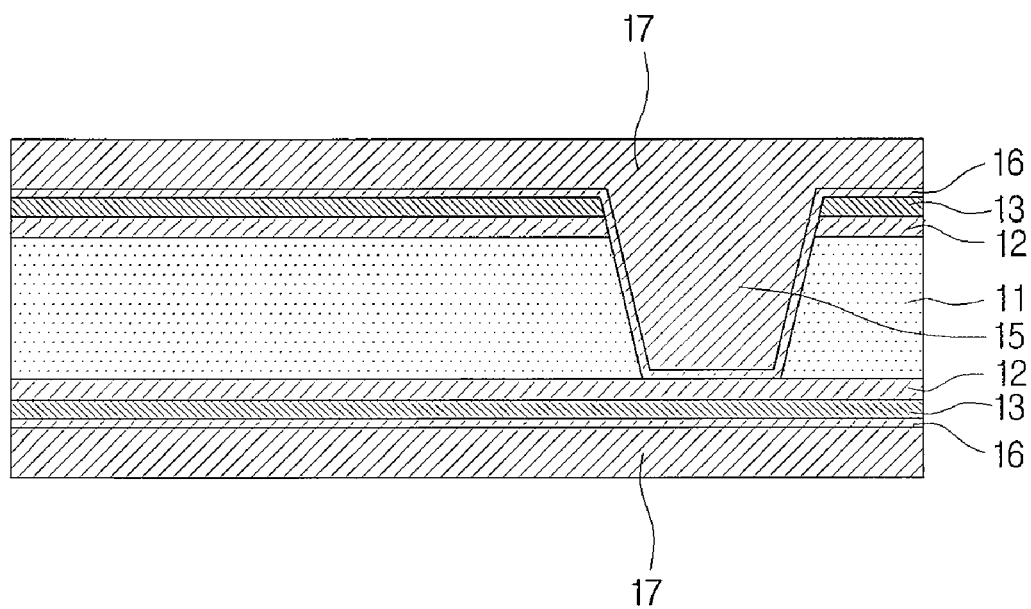

Subsequently, as shown in FIG. 12, a seed layer 16 is formed on the inner wall of the via hole 15a and on the surface of the second metal layer 13 (S130). As shown in FIG. 13, a conductive material different from that of the second metal layer 13 is plated both onto the inside of the via hole 15a and onto the second metal layer 13 (S140).

In order to form the seed layer 16, an electroless plating like a chemical copper plating can be used. As described above, when the second metal layer 13 is made of sulfonic acid nickel, the seed layer 16 and the conductive material can be made of copper just as the first metal layer 12 is made of copper.

Figure 14:
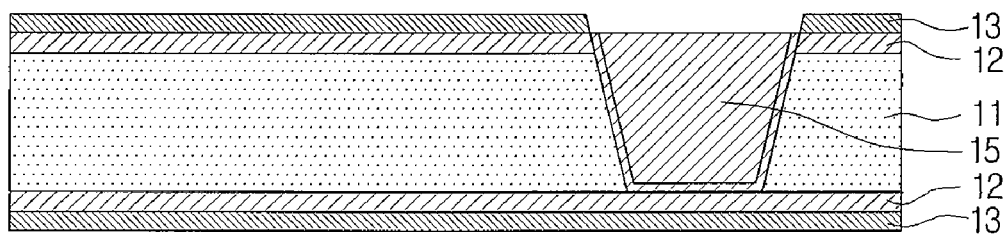

Next, the seed layer 16 and the conductive material, i.e., a plating layer 17, formed on the second metal layer 13, are etched as shown in FIG. 14 (S150). When the copper-made plating layer 17 and the seed layer 16 are etched in a state where the nickel-made second metal layer 13 is disposed beneath the seed layer and the plating layer, the corresponding etching solution does not affect the second metal layer 13 made of materials such as nickel (Ni), aluminum (Al) or chrome (Cr) so that the second metal layer 13 can perform a function as an etch-stop.

As a result, since the first metal layer 12 located beneath the second metal layer 13 is not affected by the etching solution, it is possible to construct a structure in which a via 15 is formed prior to a pattern to be formed, as shown in FIG. 14.

Figure 15:
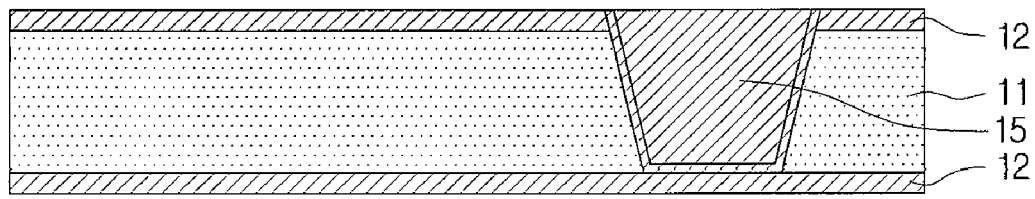

As shown in FIG. 15, the second metal layer 13 is etched (S160). Because the first metal layer 12 is made of a material different from that of the second metal layer 13, the first metal layer 12 cannot be affected by the corresponding etching solution during the process of removing the second metal layer 13 by applying the etching solution.

Figure 16:
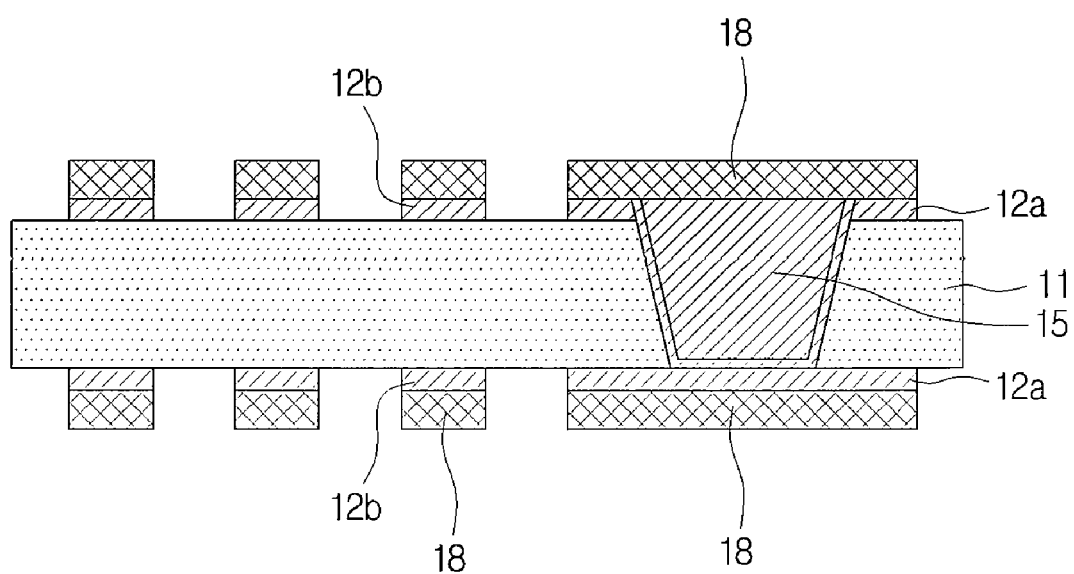
Figure 17:
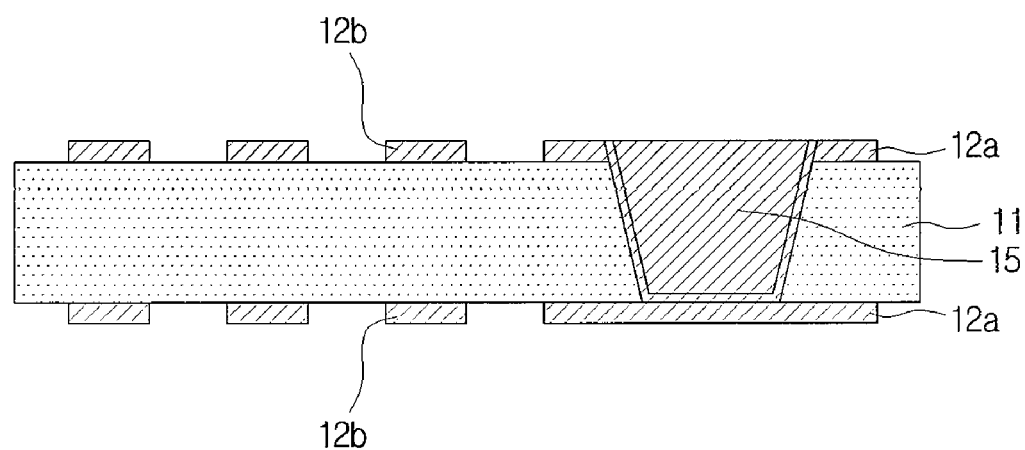

Subsequently, as shown in FIG. 16, first patterns 12a and 12b can be formed by forming an etching resist 18 patterned on the first metal layer 12 and by selectively etching the first metal layer 12 (S170).

As described above, in the embodiment of the present invention, the via 15 is first formed by using plating process, and then the patterns 12a and 12b are formed by etching process, so that it is possible to manufacture a high density printed circuit board 20 having a pattern with a uniform thickness.

While a method manufacturing of the two-layer printed circuit board 20 is proposed in FIGS. 9 to 17, it is also possible to manufacture a multi-layer printed circuit board as shown in FIGS. 18 to 21.

Figure 19:
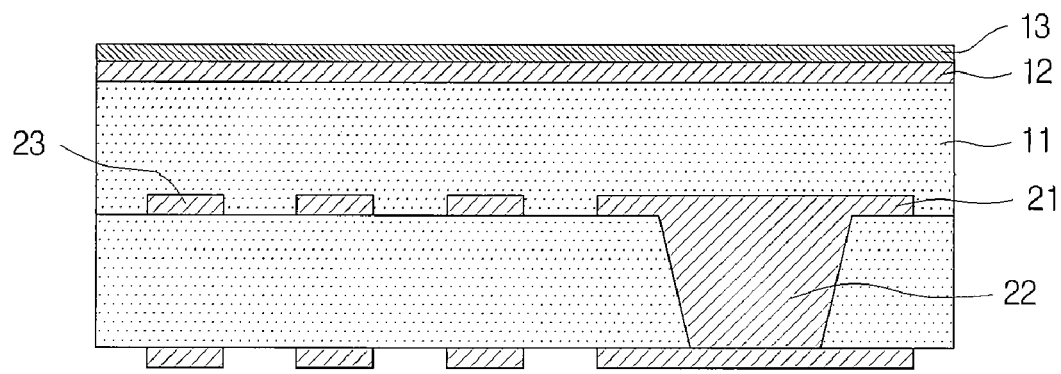

In other words, as shown in FIG. 19, a printed circuit board can be also manufactured by making use of a structure in which a circuit substrate 20 having a predetermined via 22 and patterns 21 and 23 formed therein is laminated on the lower side of the insulator 11, and in which the first metal layer 12 and the second metal layer 13 are sequentially laminated on the upper side of the insulator 11 as described above.

Figure 18:
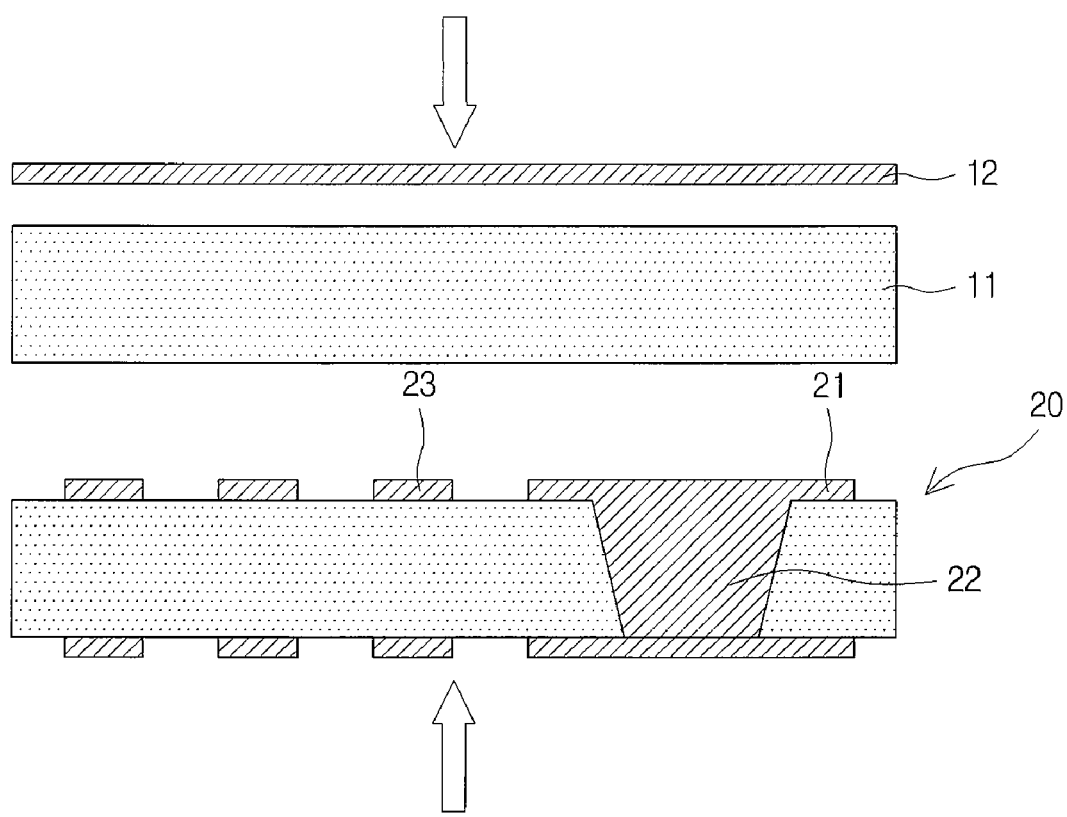

In order to construct such a structure, as shown in FIG. 18, it is possible to use a method of forming the second metal layer 13 by sequentially and collectively laminating the insulator 11 and the first metal layer 12 on the upper side of the circuit substrate 20, and then by performing the electrolytic plating onto the first metal layer 12. In addition, it shall be evident that a method of adhering a film-type second metal layer to the first metal layer can be used.

Figure 20:
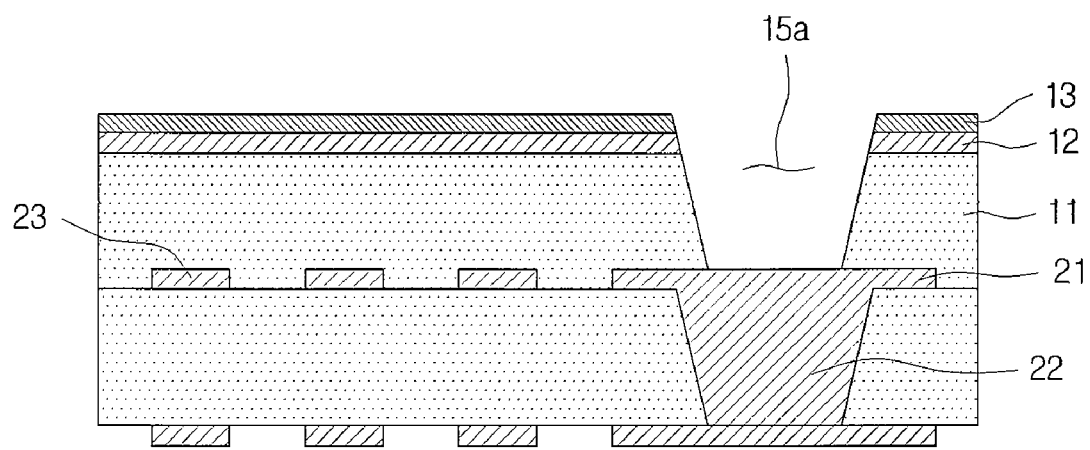
Figure 21:
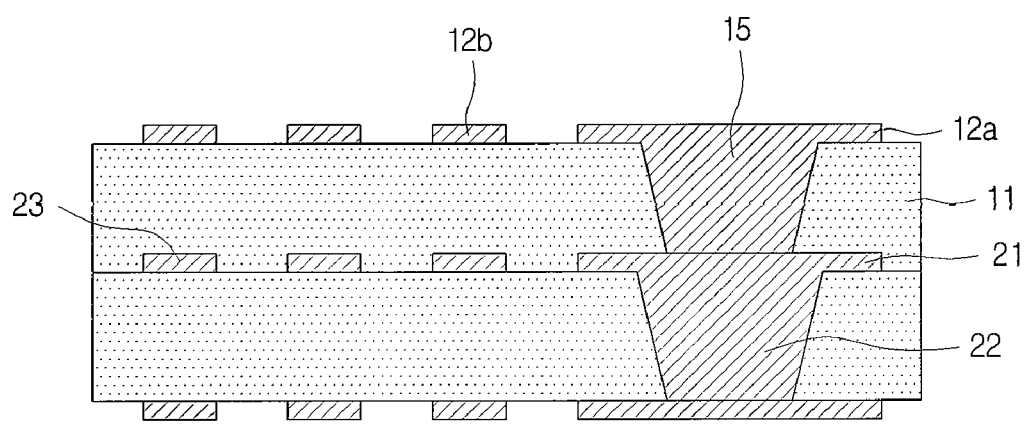

Subsequent process is the same as the process described above. That is, after the via hole 15a is processed as shown in FIG. 20, the processes S130 to S170 described above are performed. Consequently, a printed circuit board having the structure as shown in FIG. 21 can be manufactured.

In the next place, a manufacturing method of a printed circuit board according to a second embodiment of the present invention will be described.

Figure 22:
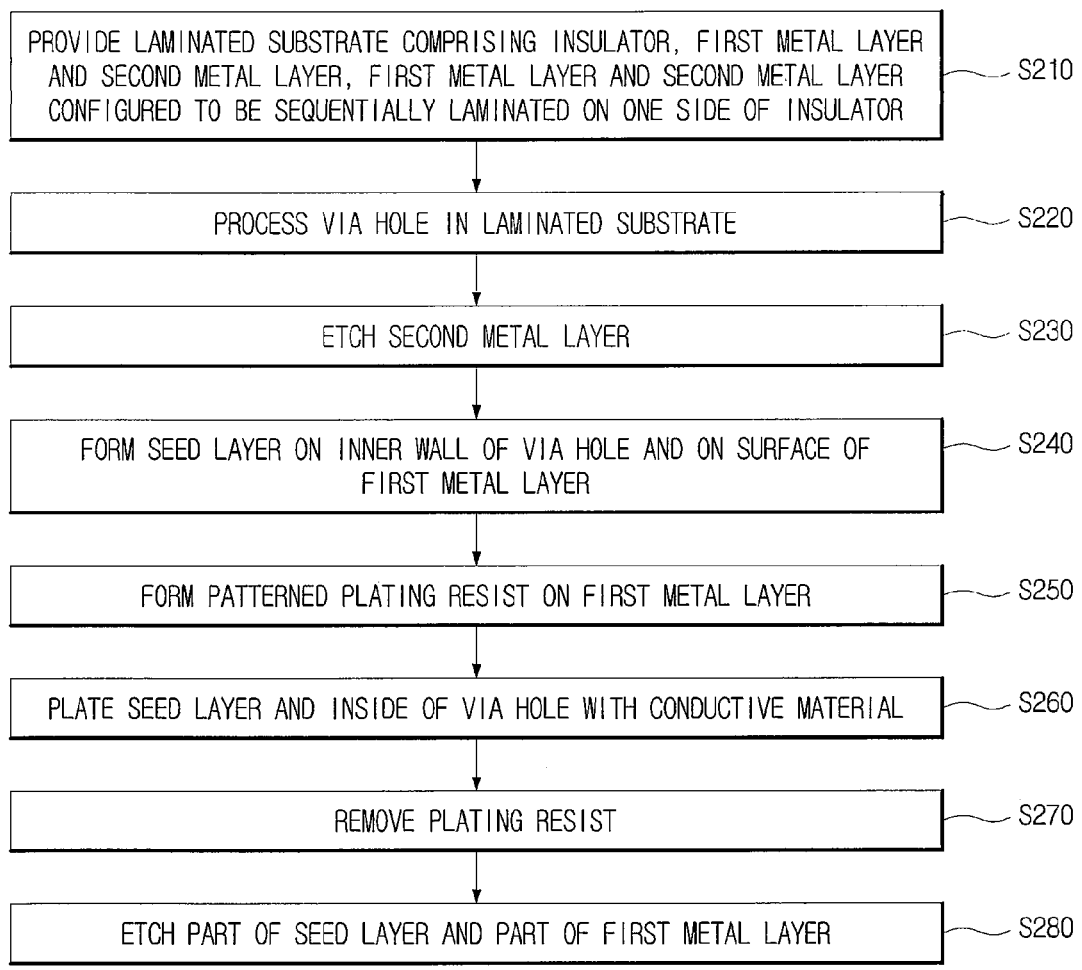
FIG. 22 shows a flowchart of a manufacturing method of a printed circuit board according to a second embodiment of the present invention.

FIG. 22 shows a flowchart of a manufacturing method of a printed circuit board according to a second embodiment of the present invention. FIGS. 23 to 29 show a manufacturing method of a printed circuit board according to a second embodiment of the present invention. Referring to FIGS. 23 to 29, illustrated are an insulator 31, a first metal layer 32, a second metal layer 33, a via 35, a via hole 35a, a seed layer 36, a plating resist 37, a pattern 38 and a pad 39.

Figure 23:
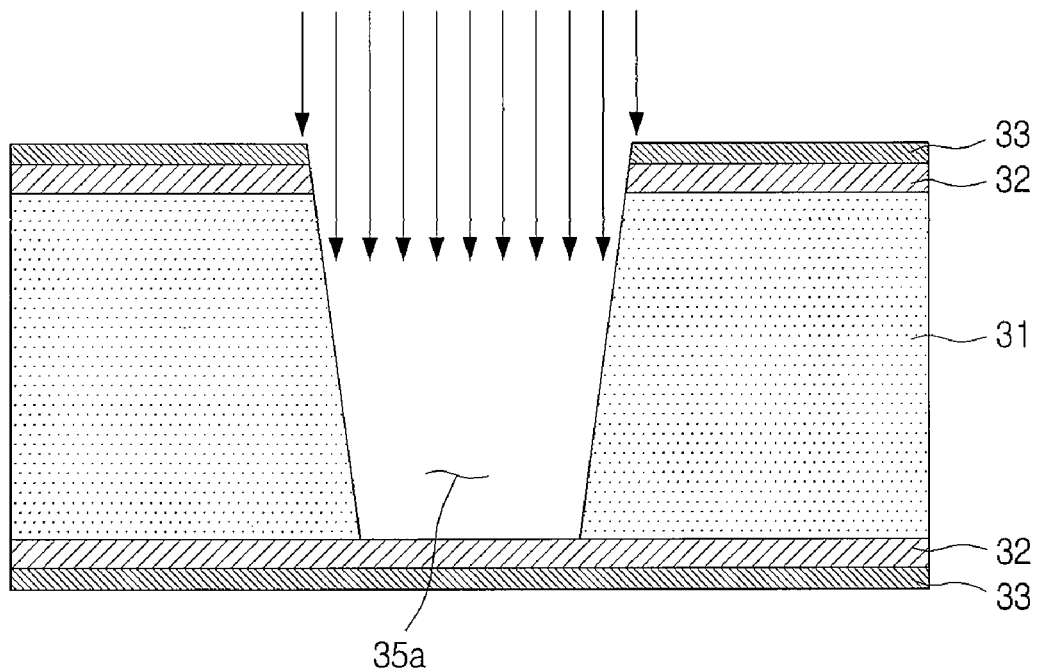
FIGS. 23 to 29 show a manufacturing method of a printed circuit board according to a second embodiment of the present invention.

First, as shown in FIG. 23, prepares is a laminated substrate including an insulator 31, and including a first metal layer 32 and a second metal layer 33 sequentially laminated on the insulator 31 (S210). A via hole 35a is processed by using $CO_2$ laser (S220). According to the embodiment of the present invention, since the second metal layer 33 is formed beneath the first metal layer 32 which is under the insulator such that the first metal layer 32 can be supported, it is possible to minimize the damage of the first metal layer 32 which is under the insulator during the process of the via hole 35a by using the $CO_2$ laser.

Figure 24:
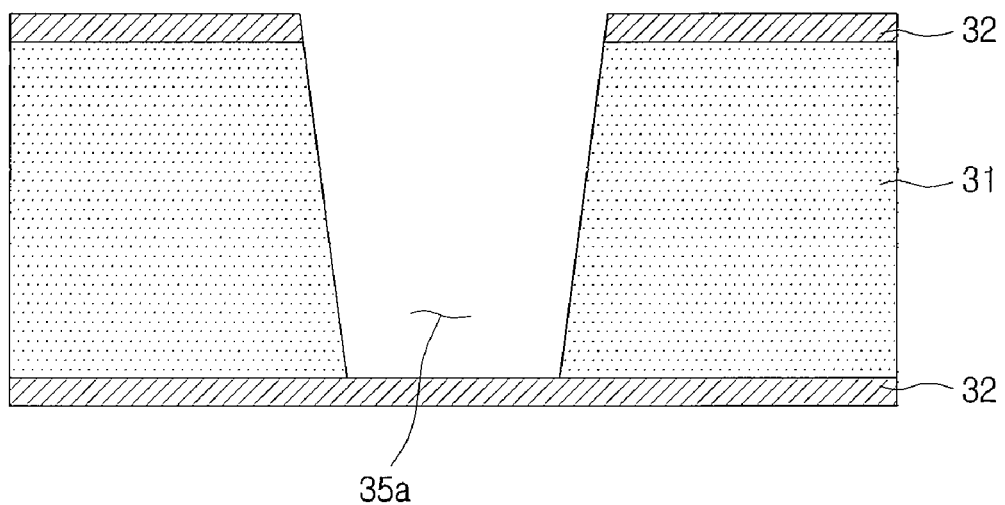

As shown in FIG. 24, the second metal layer 33 is removed (S230). The second metal layer 33 can be removed by using chemical etching. As described above, because the second metal layer 33 is made of a material different from that of the first metal layer 32, the first metal layer 32 cannot be damaged during the process of removing the second metal layer 33 by using an etching solution for removing the second metal layer 33.

Figure 25:
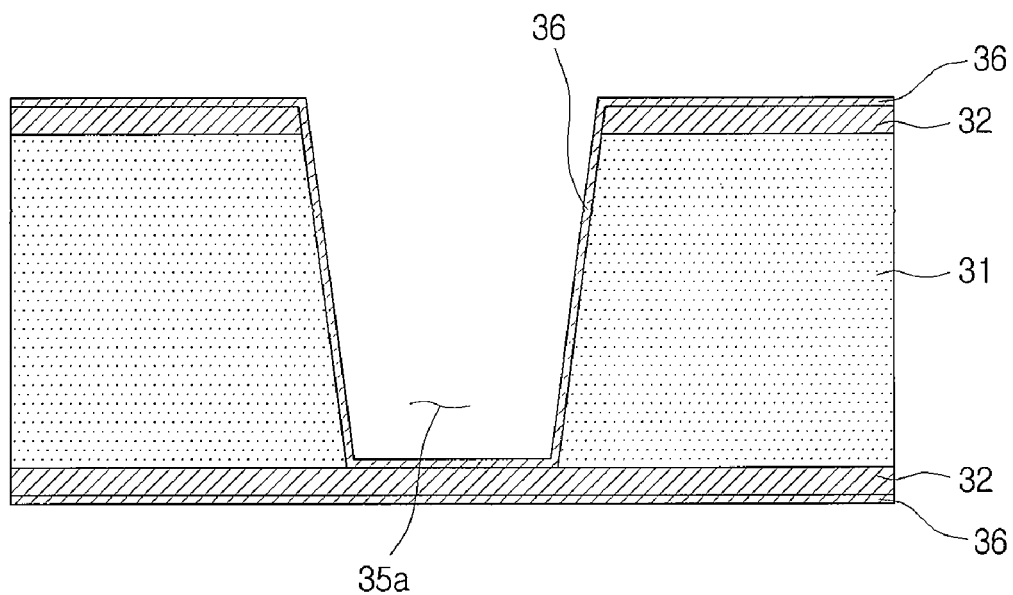
Figure 26:
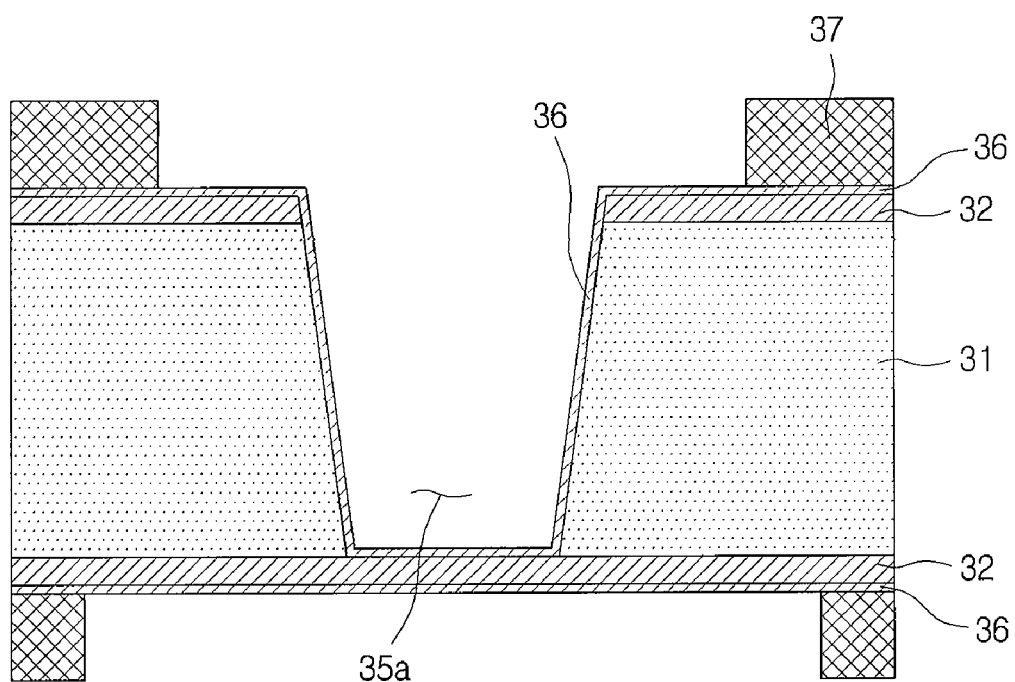
Figure 27:
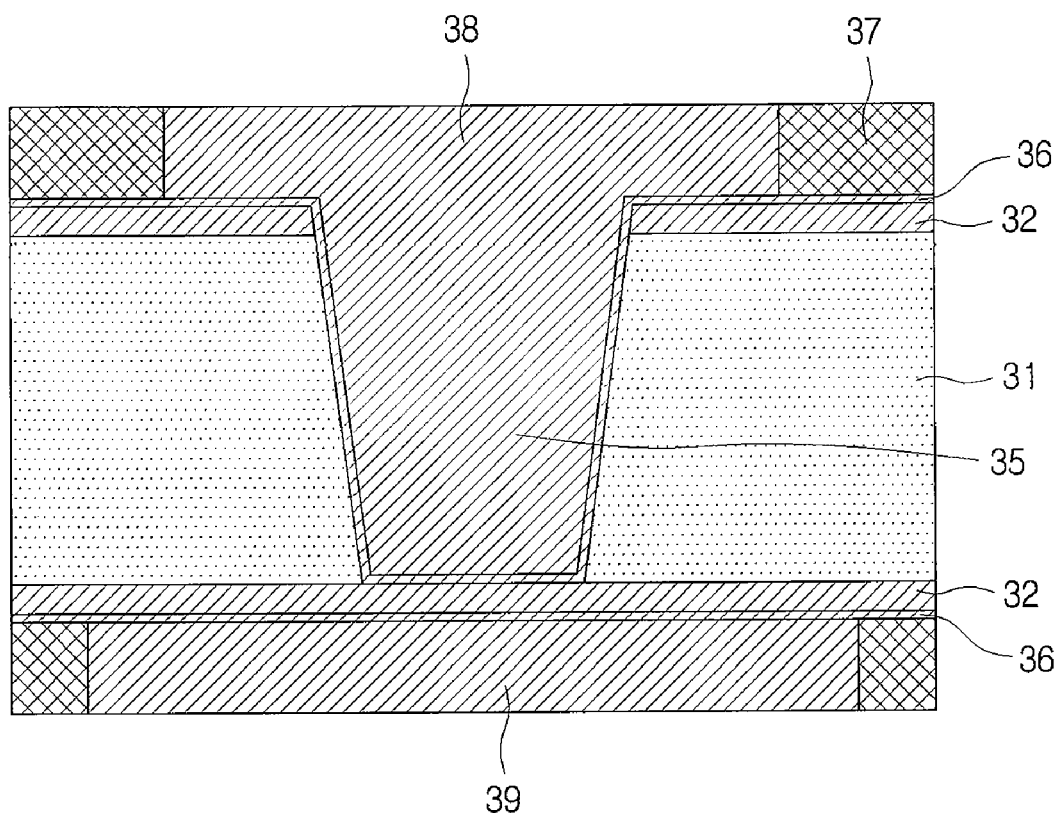

Subsequently, as shown in FIG. 25, a seed layer 36 is formed both on the surface of the first metal layer 32 and on the inner wall of the via hole 35a (S240). As shown in FIG. 26, formed is a plating resist 37 patterned so as to correspond to a pattern designed to be formed (S250), and then a conductive material is plated onto the inside of the via hole and onto the seed layer as shown in FIG. 27. As a result, a pad 39 and a pattern 38, for example, a via land are formed (S260).

Figure 28:
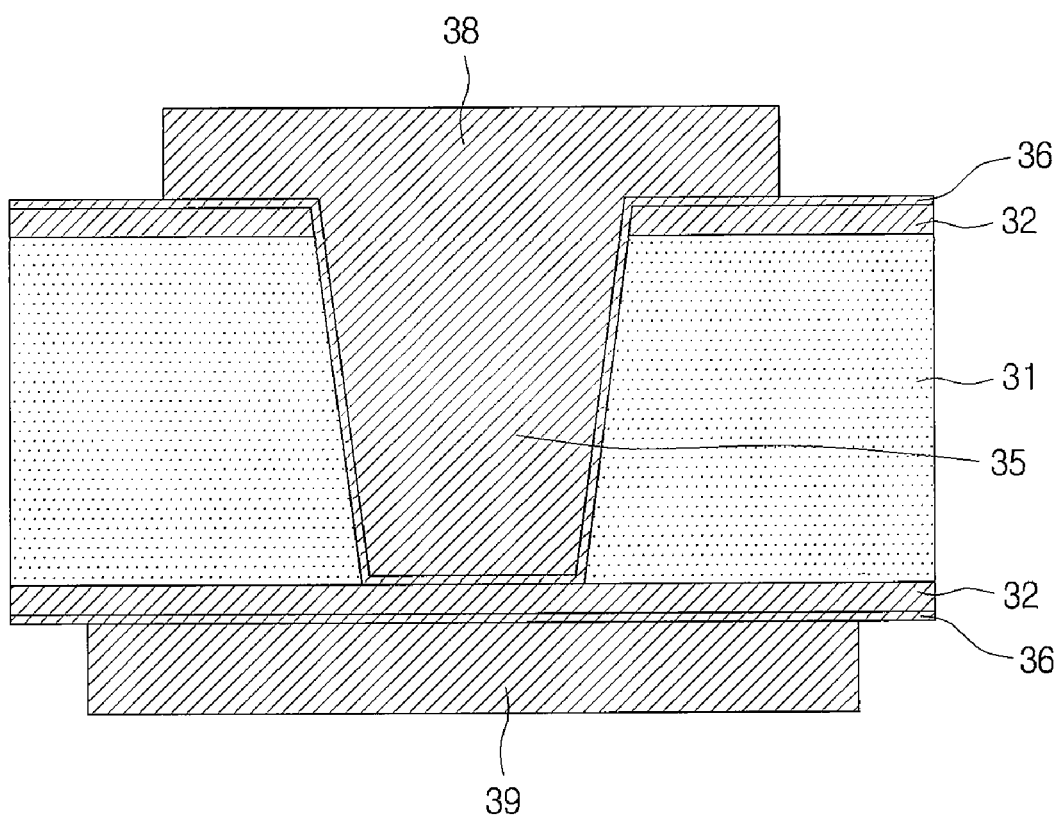
Figure 29:
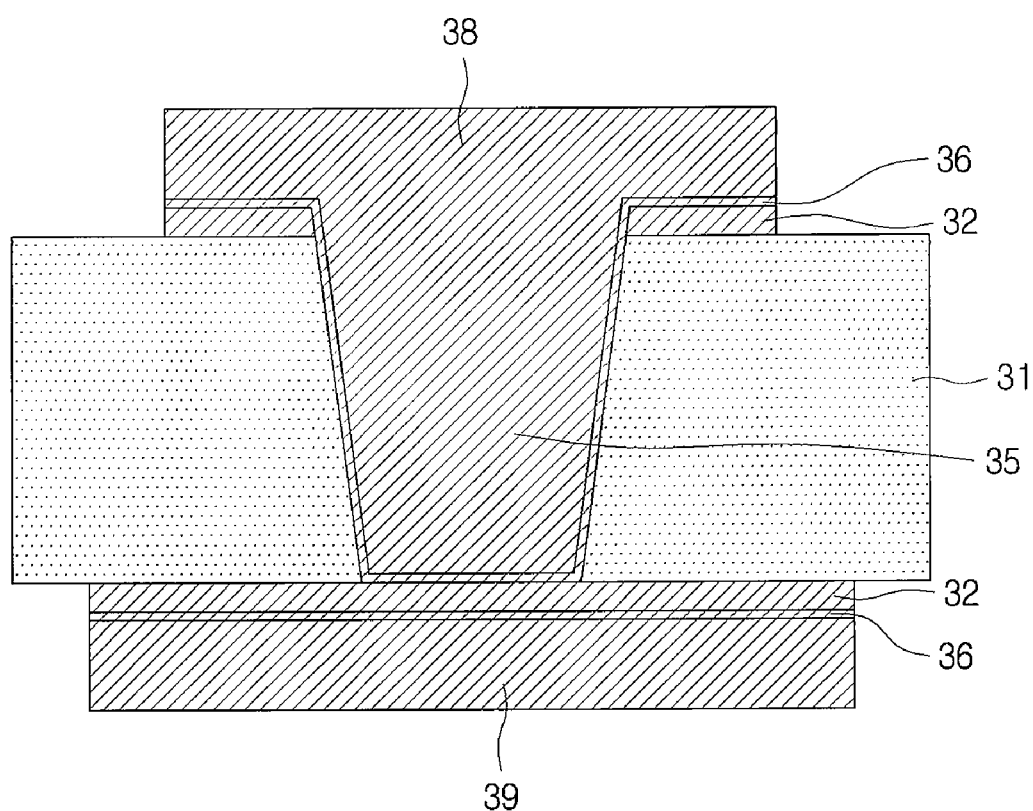

Subsequently, the plating resist 37 is removed as shown in FIG. 28 (S270) and a part of the seed layer 36 and a part of the first metal layer 32 are removed through the flash etching as shown in FIG. 29 (S280), so that a printed circuit board having a via on pad (VOP) structure directly connecting the pad 39 with the via 35 can be completed.

Figure 30:
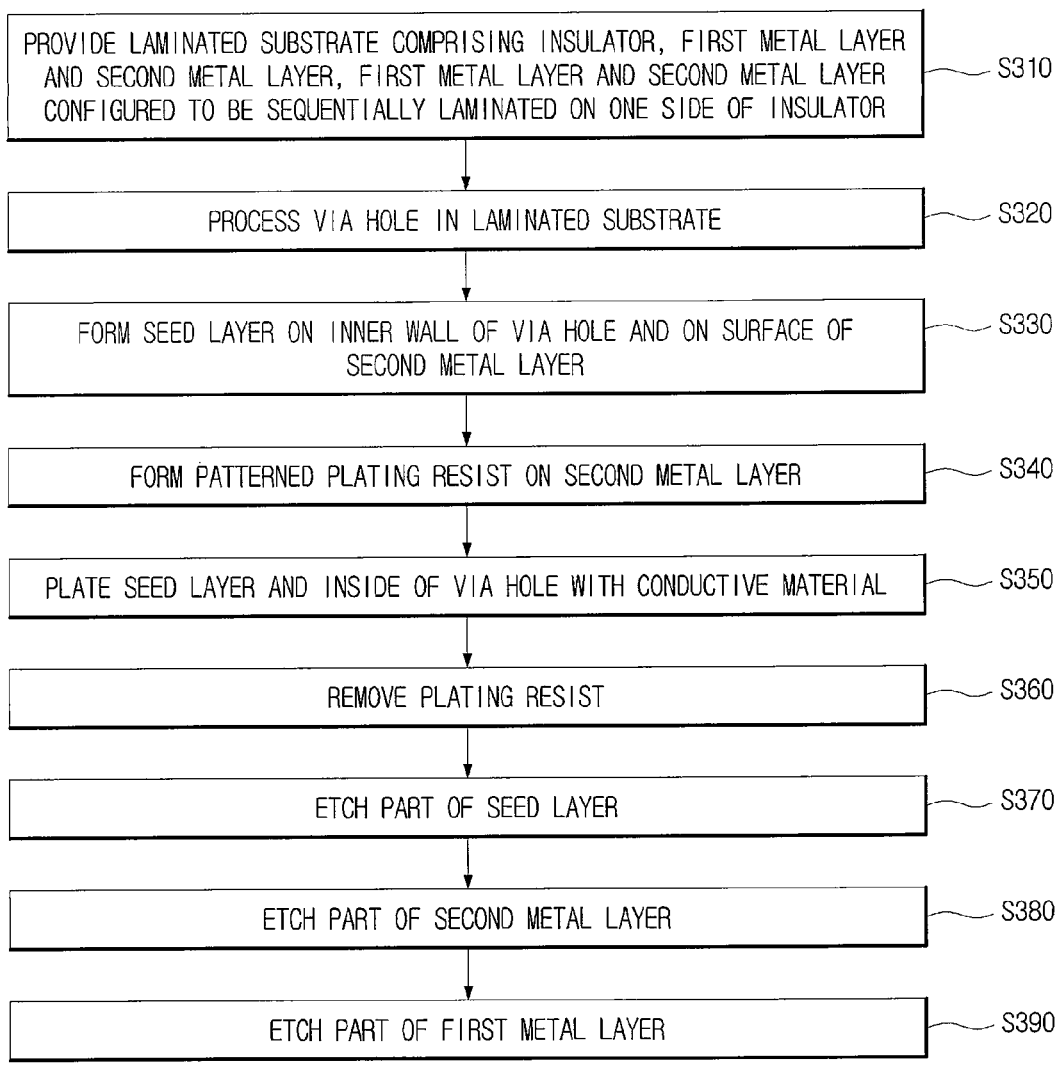
FIG. 30 shows a flowchart of a manufacturing method of a printed circuit board according to a third embodiment of the present invention.

Next, a manufacturing method of a printed circuit board according to a third embodiment of the present invention will be described. FIG. 30 shows a flowchart of a manufacturing method of a printed circuit board according to a third embodiment of the present invention. FIGS. 31 to 38 show a manufacturing method of a printed circuit board according to a third embodiment of the present invention. Referring to FIGS. 31 to 38, illustrated are an insulator 31, a first metal layer 32, a second metal layer 33, a via 35, a via hole 35a, a seed layer 36, a plating resist 37, a pattern 38 and a pad 39.

While a method of forming a seed layer 36 by processing a via hole 35a through use of a $CO_2$ laser and by removing a second metal layer 33 is proposed in the second embodiment previously described, a method of forming the seed layer 36 without removing the second metal layer 33 is proposed in this embodiment.

Figure 31:
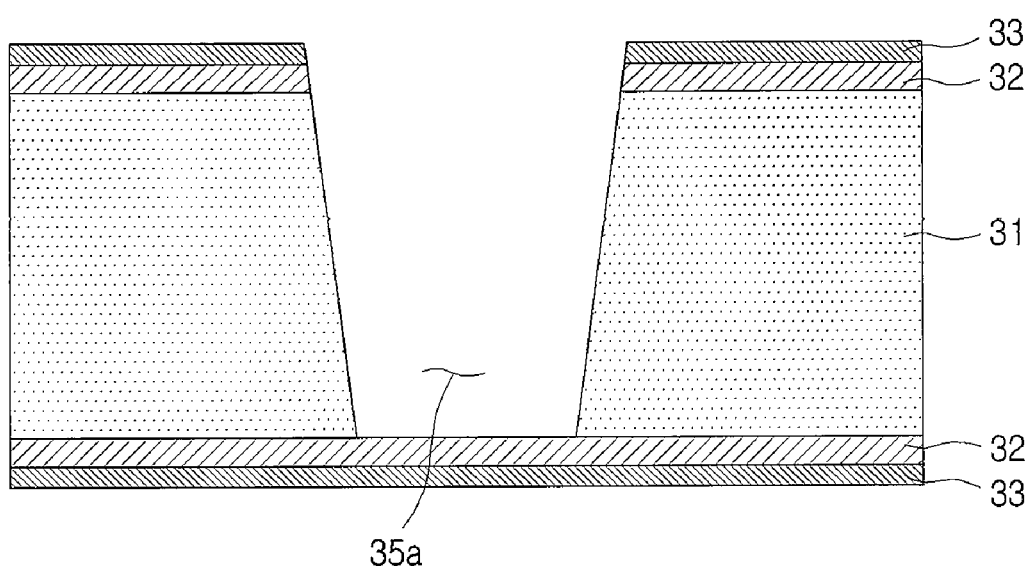
FIGS. 31 to 38 show a manufacturing method of a printed circuit board according to a third embodiment of the present invention.
Figure 32:
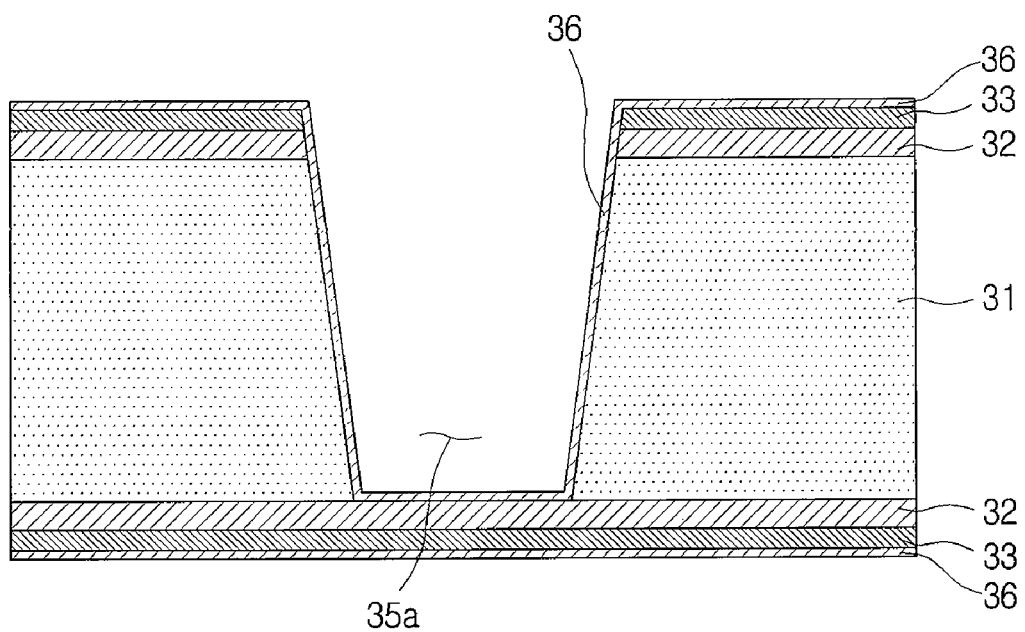

That is, as shown in FIG. 31, a via hole 35 is processed in the laminated substrate including an insulator 31, and including a first metal layer 32 and a second metal layer 33 sequentially laminated on the insulator 31 (S310 and S320). As shown in FIG. 32, a seed layer 36 can be formed both on the surface of the second metal layer 33 and on the inner wall of the via hole 35a (S330).

Figure 33:
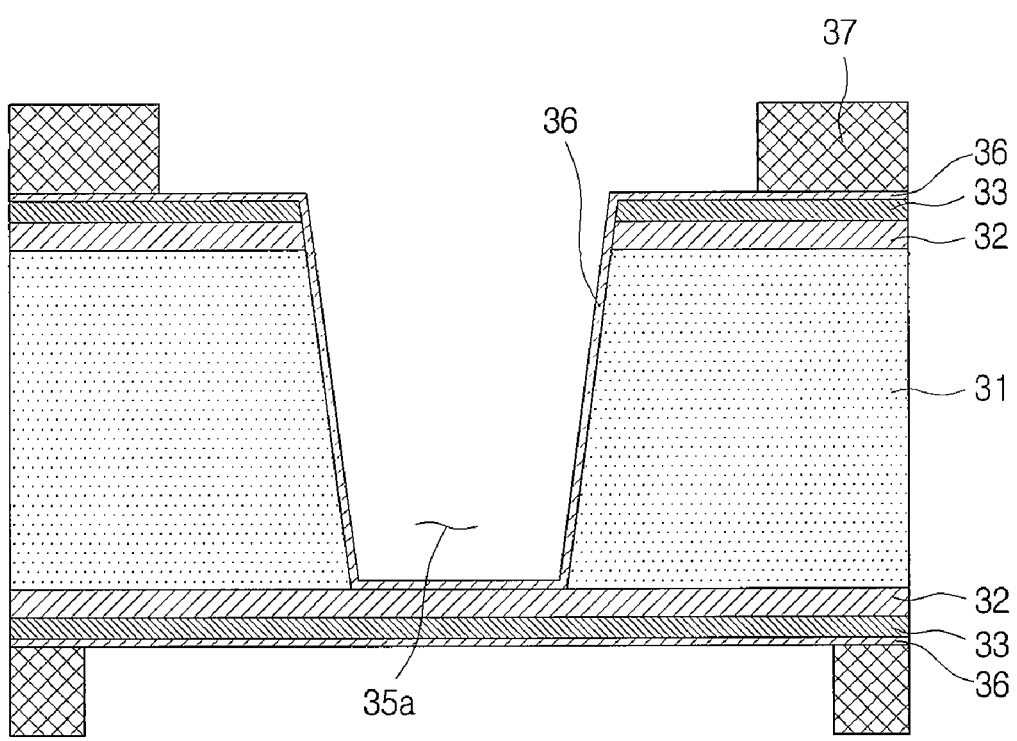
Figure 34:
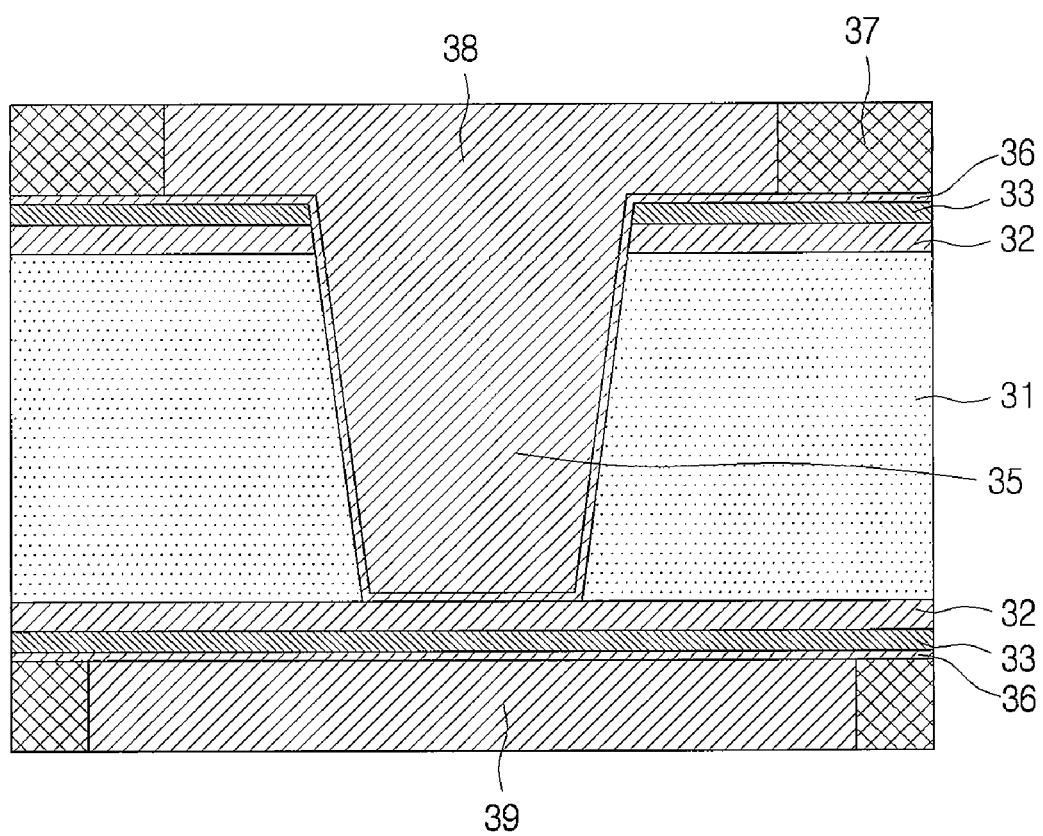
Figure 35:
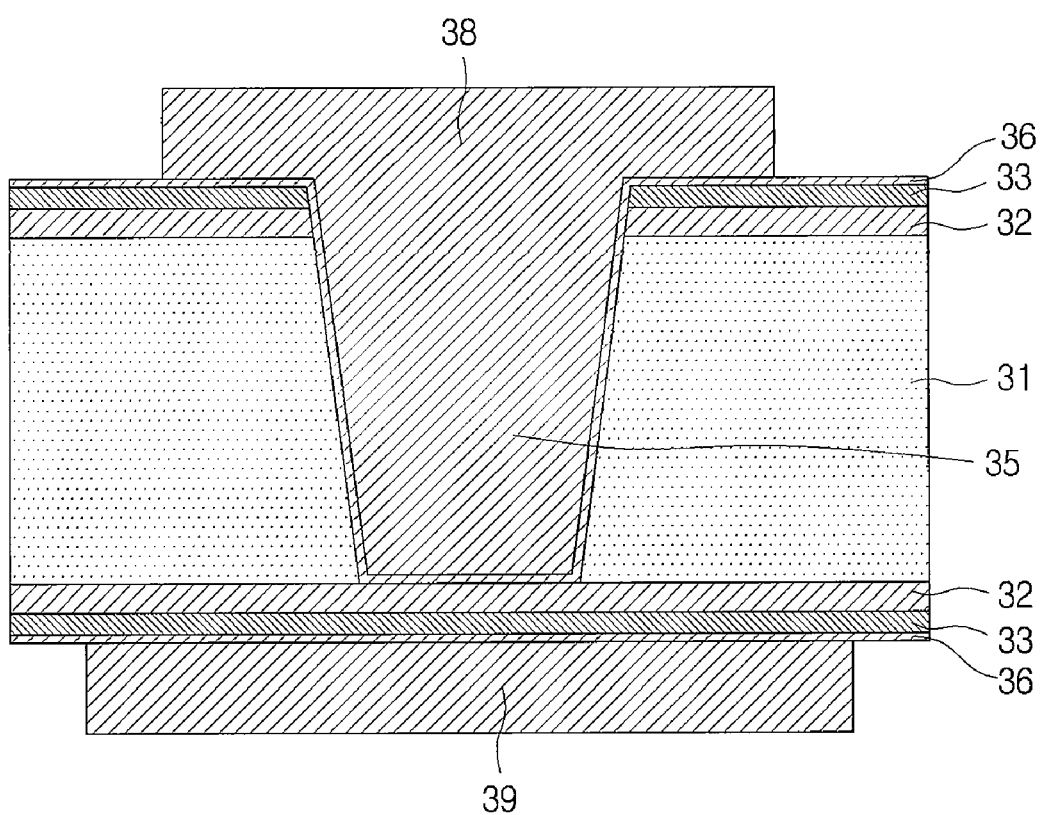

As shown in FIG. 33, a plating resist 37 is formed onto the second metal layer 33 (S340). As shown in FIG. 34, a conductive material is plated both onto the inside of the via hole and onto the seed layer (S350). As shown in FIG. 35, the plating resist 37 is removed (S360).

Figure 36:
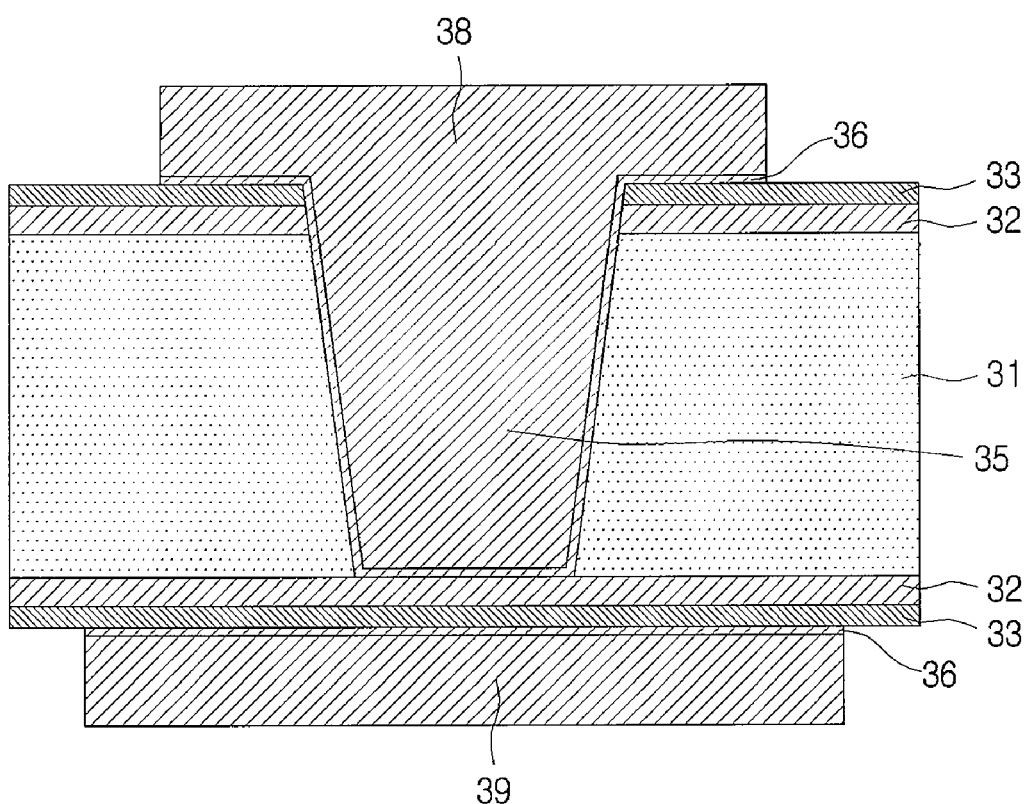
Figure 37:
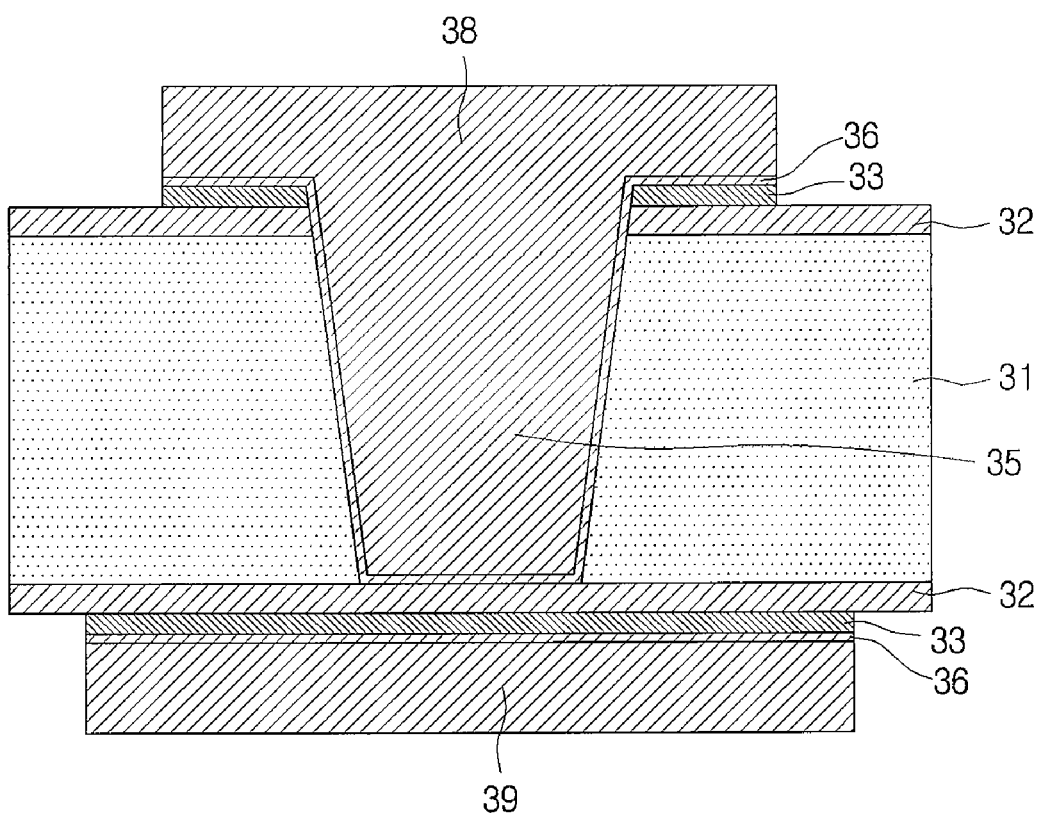
Figure 38:
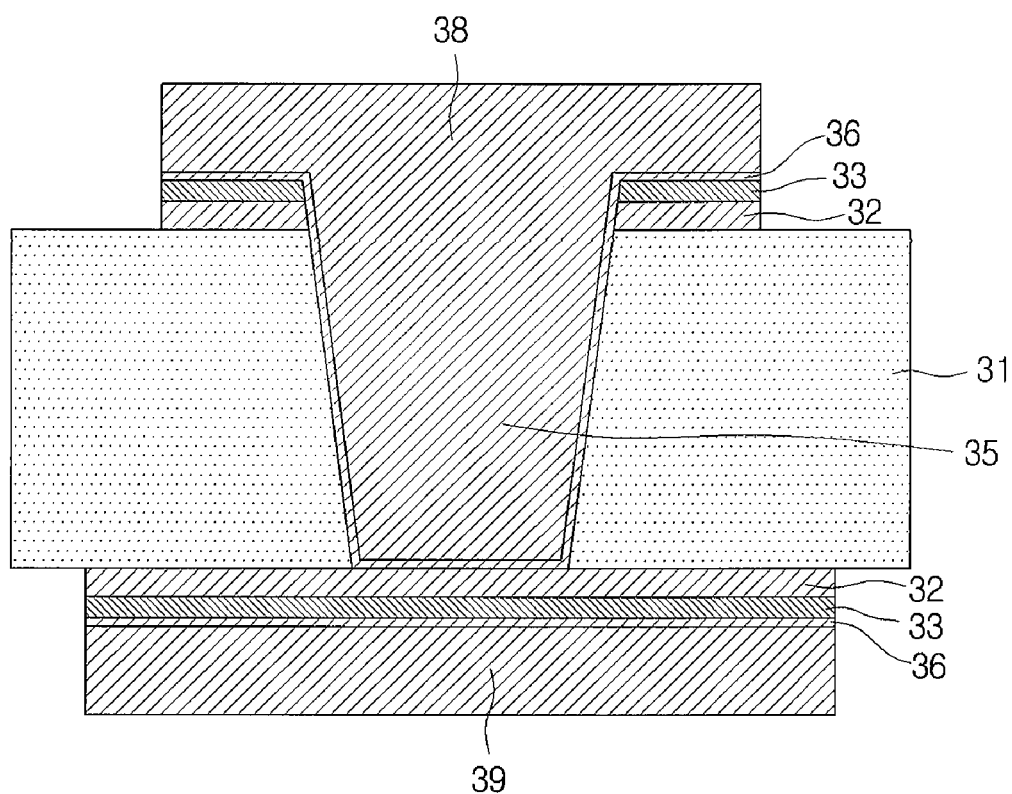

In this case, since the second metal layer 33 remains, a printed circuit board having a via on pad (VOP) structure can be manufactured by a method of removing the seed layer 36 through a flash etching as shown in FIG. 36 (S370), and then by removing a part of the second metal layer 33 as shown in FIG. 37 (S380) and by removing a part of the metal layer 32 as shown in FIG. 38 (S390).

While certain embodiment of the present invention has been described, it shall be understood by those skilled in the art that various changes and modification in forms and details may be made without departing from the spirit and scope of the present invention as defined by the appended claims.

Numerous embodiments other than embodiments described above are included within the scope of the present invention.

What is claimed is:

1. A method of manufacturing a printed circuit board, the method comprising:
   providing a laminated substrate comprising an insulator, a first metal layer and a second metal layer, the first metal layer and the second metal layer laminated on one side of the insulator;
   processing a via hole in the laminated substrate;
   forming a seed layer on an inner wall of the via hole and on a surface of the second metal layer;
   plating an inside of the via hole and the surface of the second metal layer with a conductive material, the conductive material being different from a material of the second metal layer;
   etching the seed layer and the conductive material formed on the second metal layer so as to form a via;
   etching the second metal layer to completely remove the second metal layer; and
   forming a first circuit pattern by selectively etching the first metal layer.

2. The method of claim 1, wherein the first metal layer and the conductive material are made of a material comprising copper (Cu), and the second metal layer is made of a material comprising at least one of nickel (Ni), aluminum (Al) and chrome (Cr).

3. The method of claim 1, wherein the providing of the laminated substrate is performed by plating the first metal layer laminated on the insulator with a material corresponding to the second metal layer.

4. The method of claim 1, wherein a circuit substrate having a second circuit pattern formed on the surface thereof is laminated on another side of the insulator.

5. The method of claim 1, wherein the plating is performed to allow the conductive material to be filled inside the via hole.

* * * * *